US010900133B2

(12) United States Patent
Lin et al.

(10) Patent No.: US 10,900,133 B2
(45) Date of Patent: Jan. 26, 2021

(54) NITRIDE CATALYST AND METHOD FOR MANUFACTURING THE SAME

(71) Applicant: INDUSTRIAL TECHNOLOGY RESEARCH INSTITUTE, Hsinchu (TW)

(72) Inventors: Kuo-Hsin Lin, Hsinchu (TW); Li-Duan Tsai, Hsinchu (TW); Wen-Hsuan Chao, Zhunan Township (TW); Chiu-Ping Huang, Taoyuan (TW); Pin-Hsin Yang, Tainan (TW); Hsiao-Chun Huang, Taoyuan (TW); Jiunn-Nan Lin, Taoyuan (TW); Yu-Ming Lin, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/205,349

(22) Filed: Nov. 30, 2018

(65) Prior Publication Data

US 2020/0173043 A1 Jun. 4, 2020

(51) Int. Cl.
*C25B 11/04* (2006.01)
*C01B 21/06* (2006.01)
(Continued)

(52) U.S. Cl.
CPC ...... *C25B 11/0447* (2013.01); *C01B 21/0615* (2013.01); *C01B 21/0622* (2013.01);
(Continued)

(58) Field of Classification Search
None
See application file for complete search history.

(56) References Cited

U.S. PATENT DOCUMENTS

| 7,485,600 B2 | 2/2009 | Harutyunyan et al. |
| 8,632,672 B2 | 1/2014 | Soloveichik |

(Continued)

FOREIGN PATENT DOCUMENTS

| CN | 101209424 A | 7/2008 |
| CN | 102299347 A | 12/2011 |

(Continued)

OTHER PUBLICATIONS

Taiwanese Office Action and Search Report, dated Jun. 12, 2019, for Taiwanese Application No. 107142989.

(Continued)

*Primary Examiner* — Guinever S Gregorio
(74) *Attorney, Agent, or Firm* — Birch, Stewart, Kolasch & Birch, LLP

(57) ABSTRACT

A method for manufacturing nitride catalyst is provided, which includes putting a Ru target and an M target into a nitrogen-containing atmosphere, in which M is Ni, Co, Fe, Mn, Cr, V, Ti, Cu, or Zn. The method also includes providing powers to the Ru target and the M target, respectively. The method also includes providing ions to bombard the Ru target and the M target for depositing $M_xRu_yN_2$ on a substrate by sputtering, wherein $0<x<1.3$, $0.7<y<2$, and $x+y=2$, wherein $M_xRu_yZ_2$ is cubic crystal system or amorphous.

4 Claims, 11 Drawing Sheets

(51) Int. Cl.
*C25B 1/10* (2006.01)
*C30B 25/06* (2006.01)
*C30B 29/38* (2006.01)

(52) U.S. Cl.
CPC .......... *C25B 1/10* (2013.01); *C25B 11/0405* (2013.01); *C25B 11/0415* (2013.01); *C30B 25/06* (2013.01); *C30B 29/38* (2013.01); *C01P 2002/02* (2013.01); *C01P 2002/76* (2013.01)

(56) References Cited

U.S. PATENT DOCUMENTS

| | | | |
|---|---|---|---|
| 9,287,568 | B2 | 3/2016 | Wood et al. |
| 9,683,300 | B2 | 6/2017 | Noaki et al. |
| 2008/0029396 | A1 | 2/2008 | Shirakura et al. |
| 2009/0318723 | A1* | 12/2009 | Kortz .................. B01J 23/002 556/9 |
| 2012/0103829 | A1 | 5/2012 | Tampucci et al. |
| 2014/0124360 | A1 | 5/2014 | Funahashi |
| 2015/0180046 | A1 | 6/2015 | Serov et al. |
| 2015/0292095 | A1 | 10/2015 | Haber et al. |
| 2016/0009574 | A1 | 1/2016 | Hoffmann et al. |
| 2016/0077035 | A1 | 3/2016 | Kanemoto et al. |
| 2016/0079604 | A1 | 3/2016 | Atanasoski et al. |
| 2016/0160365 | A1 | 6/2016 | Cao et al. |
| 2017/0051419 | A1 | 2/2017 | Jang et al. |
| 2017/0233879 | A1 | 8/2017 | Kumta et al. |

FOREIGN PATENT DOCUMENTS

| | | |
|---|---|---|
| CN | 103422116 A | 12/2013 |
| CN | 103952719 A | 7/2014 |
| CN | 104327971 A | 2/2015 |
| CN | 105734606 B | 6/2018 |
| CN | 108884576 A | 11/2018 |
| KR | 10-2017-0022788 A | 3/2017 |
| TW | 544968 B | 1/2017 |
| TW | 201718396 A | 6/2017 |
| TW | 201837236 A | 10/2018 |
| TW | 201840907 A | 11/2018 |
| WO | WO 2017/001843 A1 | 1/2017 |

OTHER PUBLICATIONS

Taiwanese Office Action and Search Report, dated Jun. 12, 2019, for Taiwanese Application No. 107142990.

Bouhtiyya et al., "Application of sputtered ruthenium nitride thin films as electrode material for energy-storage devices," Scripta Materialia, vol. 68, 2013 (Available online Feb. 4, 2013), pp. 659-662.

Cattaruzza et al., "On the synthesis of a compound with positive enthalpy of formation: Zinc-blende-like RuN thin films obtained by rf-magnetron sputtering," Applied Surface Science, vol. 320, 2014 (Available online Oct. 2, 2014), pp. 863-870.

Karimi et al., "Metal Carbide and Oxide Supports for Iridium-Based Oxygen Evolution Reaction Electrocatalysts for Polymer-Electrolyte-Membrane Water Electrolysis," Electrochimica Acta, vol. 246, 2017 (Available online Jun. 15, 2017), pp. 654-670.

Li et al., "Nitrogen and Phosphorus Dual-Doped Graphene/Carbon Nanosheets as Bifunctional Electrocatalysts for Oxygen Reduction and Evolution," ACS Catalysis, vol. 5, May 27, 2015, pp. 4133-4142.

Rosestolato et al., "Electrochemical properties of stoichiometric RuN film prepared by rf-magnetron sputtering: A preliminary study," Electrochemistry Communications, vol. 49, 2014 (Available online Oct. 5, 2014), pp. 9-13.

Tang et al., "A Co-doped porous niobium nitride nanogrid as an effective oxygen reduction catalyst," Journal of Materials Chemistry A, vol. 5, Jun. 12, 2017, pp. 14278-14285.

Taiwanese Notice of Allowance and Search Report dated Mar. 28, 2019 for Application No. 107142991.

Taiwanese Office Action and Search Report, dated Apr. 18, 2019, for Taiwanese Application No. 107142987.

Arockiasamy et al., "Ductility Behaviour of Cubic Titanium Niobium Nitride Ternary Alloy: A First-Principles Study," Indian J Phys, vol. 90, No. 2, Feb. 2016 (Published online Jul. 21, 2015), pp. 149-154.

U.S. Office Action, dated Jun. 25, 2020, for U.S. Appl. No. 16/204,905.

* cited by examiner

NITRIDE CATALYST AND METHOD FOR MANUFACTURING THE SAME

TECHNICAL FIELD

The technical field relates to catalyst material and a method for manufacturing the same.

BACKGROUND

Seeking alternative energy is imperative now due to energy shortages, and hydrogen energy is the best choice. Using hydrogen gas as a fuel meets the requirements of environmental protection, and electrolysis of water is the easiest way to generate hydrogen and oxygen. Although electrolyzing water to generate hydrogen has many advantages, it still has a fatal flaw in that it consumes a lot of energy and results in a high cost. The high energy consumption in the electrolysis of water is related to a high over potential, and the over potential is related to electrodes, electrolyte, and the product of the electrochemical reaction. The electrodes are critical to enhancing the electrolysis performance of water. Lowering the activity energy and increasing the reaction interface are critical factors in the electrolysis performance of water. The activity energy can be lowered by the catalyst influence on the electrode surface, which is determined by the inherent catalytic properties of the electrode material. Although noble metal Pt is one of the most catalytic electrode materials, it is expensive. As such, Pt must be replaced with other materials to lower the cost.

Accordingly, a novel catalyst for further enhancing activities of hydrogen evolution reaction (HER) and oxygen evolution reaction (OER) for simultaneously achieving the catalyst activity and lowering the cost is called for.

SUMMARY

One embodiment of the disclosure provides a nitride catalyst, having a chemical structure of: $M_xRu_yN_2$, wherein M is Ni, Co, Fe, Mn, Cr, V, Ti, Cu, or Zn; $0<x<1.3$, $0.7<y<2$, and $x+y=2$, wherein the nitride catalyst is a cubic crystal system or amorphous.

In one embodiment, M is Ni, $0.069<x<1.086$, and $0.914<y<1.931$.

In one embodiment, M is Mn, $0.01<x<0.8$, and $1.2<y<1.99$.

In one embodiment, the nitride catalyst has a surface morphology of a tetrahedron or a pyramid.

One embodiment of the disclosure provides a method for manufacturing a nitride catalyst, including: putting a Ru target and an M target into a nitrogen-containing atmosphere, wherein M is Ni, Co, Fe, Mn, Cr, V, Ti, Cu, or Zn; providing power to the Ru target and the M target, respectively; and providing ions to bombard the Ru target and the M target, to sputtering deposit $M_xRu_yN_2$ on a substrate, wherein $0<x<1.3$, $0.7<y<2$, and $x+y=2$, wherein $M_xRu_yN_2$ is a cubic crystal system or amorphous.

In one embodiment, the power provided to the Ru target is 10 W to 200 W, and the power provided to the M target is 10 W to 200 W.

In one embodiment, the nitrogen-containing atmosphere has a pressure of 1 mTorr to 30 mTorr.

In one embodiment, the nitrogen-containing atmosphere includes carrier gas, and the nitrogen and the carrier gas have a partial pressure ratio of 0.1 to 10.

In one embodiment, the substrate includes a porous conductive layer.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
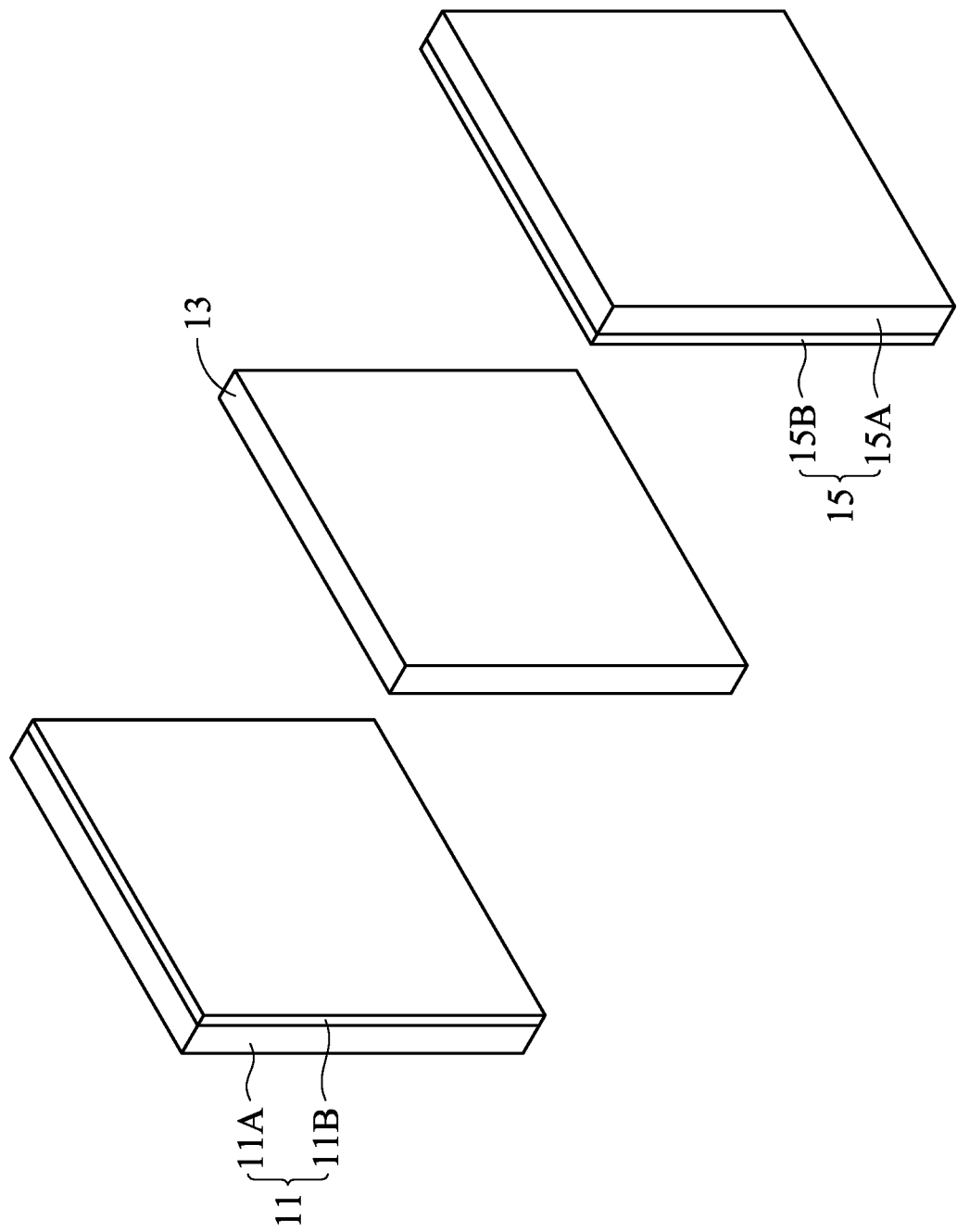
FIG. 1 shows a membrane electrode assembly in one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

One embodiment of the disclosure provides a nitride catalyst of $M_xRu_yN_2$, wherein M is Ni, Co, Fe, Mn, Cr, V, Ti, Cu, or Zn, $0<x<1.3$, $0.7<y<2$, and $x+y=2$, wherein $M_xRu_yN_2$ is a cubic crystal system or amorphous. If the nitride catalyst is another crystal system (e.g. hexagonal crystal system), its catalytic effect in HER is lower than that of commercially available Pt catalyst. In one embodiment, M is Ni, $0.069<x<1.086$, and $0.914<y<1.931$. In one embodiment, M is Mn, $0.01<x<0.8$, and $1.2<y<1.99$. If x is too low (e.g. y is too high), the activity and the stability of the nitride catalyst will be poor. If x is too high (e.g. y is too low), the activity and the stability of the nitride catalyst will be poor. In one embodiment, the nitride catalyst has a surface morphology of a tetrahedron or a pyramid, which can be beneficial to anti-oxidation of the nitride catalyst, such that the nitride catalyst is appropriate for use as the anode of OER.

One embodiment of the disclosure provides a method of forming the nitride catalyst, including putting a Ru target and a M target in a nitrogen-containing atmosphere, wherein M is Ni, Co, Fe, Mn, Cr, V, Ti, Cu, or Zn. Powers are provided to the Ru target and to the M target, and ions bombard the Ru target and the M target for sputtering deposit of $M_xRu_yN_2$ on the substrate, wherein $0<x<1.3$, $0.7<y<2$, and $x+y=2$, wherein the nitride catalyst is a cubic crystal system or amorphous. In one embodiment, the nitrogen-containing atmosphere has a pressure of 1 mTorr to 30 mTorr. If the pressure of the nitrogen-containing atmosphere is too low or too high, the nitridation cannot efficiently perform. In one embodiment, the nitrogen-containing atmosphere includes a carrier gas such as helium, argon, another suitable inert gas, or a combination thereof. The nitrogen and the carrier gas have a partial pressure ratio of 0.1 to 10. If the partial pressure ratio of the nitrogen is too low or too high, the nitridation cannot efficiently perform. The method respectively provides powers to the Ru target and the M target. For example, the power applied to the Ru target is 10 W to 200 W. If the power applied to the Ru target is too low, the Ru ratio in the nitride catalyst will be too low. If the power applied to the Ru target is too high, the Ru ratio in the catalyst material will be too high.

On the other hand, the power applied to the M target is 10 W to 200 W. If the power applied to the M target is too low, the M ratio in the catalyst material will be too low. If the power applied to the M target is too high, the M ratio in the catalyst material will be too high. The power can be direct current power of RF power.

The method also provides ions to bombard the Ru target and the M target for sputtering deposit $M_xRu_yN_2$ on the substrate. For example, nitrogen gas and the carrier gas can be excited by plasma to form ions, and the targets are bombarded by the ions. In one embodiment, the substrate includes a porous conductive layer, such as porous metal mesh (e.g. stainless steel mesh, Ti mesh, Ni mesh, Ni alloy mesh, niobium alloy mesh, copper mesh, or aluminum mesh) or porous carbon material (e.g. carbon paper or carbon cloth). The pore size of the porous conductive layer is determined by the application of $M_xRu_yN_2$. For example, if the porous conductive layer with $M_xRu_yN_2$ thereon serves as the cathode in HER to electrolyze an alkaline aqueous solution, the porous conductive layer will have a pore size of 0.5 micrometers to 80 micrometers. If the porous conductive layer with $M_xRu_yN_2$ thereon serves as the anode in OER to electrolyze an alkaline aqueous solution, the porous conductive layer will have a pore size of 40 micrometers to 150 micrometers.

In one embodiment, the nitride catalyst can be used as a membrane electrode assembly for generating hydrogen by electrolysis. As shown in FIG. 1, the membrane electrode assembly 100 includes an anode 11, a cathode 15, and an anion exchange membrane 13 disposed between the anode 11 and the cathode 15. The anode 11 includes a catalyst layer 11B on the gas-liquid diffusion layer 11A, and the cathode 15 includes a catalyst layer 15B on the gas-liquid diffusion layer 15A. In addition, the anion exchange membrane 13 is interposed between the catalyst layer 11B of the anode 11 and catalyst layer 15B of the cathode 15. The catalyst layer 11B, the catalyst layer 15B, or both has a chemical structure of $M_xRu_yN_2$ and the definitions of M, x, and y are similar to those described above and not repeated here.

In one embodiment, the anion exchange membrane 13 can be a halogen ion-containing imidazole polymer or another suitable material. For example, the anion exchange membrane 13 can be FAS (commercially available from Fumatech) or X37-50 (commercially available from Dioxide materials). Because the membrane electrode assembly 100 is used to generate hydrogen by electrolyzing alkaline aqueous solution, the anion exchange membrane 13 is adopted rather than another ionic exchange membrane.

In one embodiment, each of the gas-liquid diffusion layers 11A and 15A includes a porous conductive layer, such as a porous metal mesh (e.g. a stainless steel mesh, Ti mesh, Ni mesh, Ni alloy mesh, niobium alloy mesh, copper mesh, or aluminum mesh) or a porous carbon material (e.g. carbon paper or carbon cloth). In one embodiment, the gas-liquid diffusion layer 11A has a pore size of 40 micrometers to 150 micrometers. If the pore size of the gas-liquid diffusion layer 11A is too small, the mass transfer resistance will increase. If the pore size of the gas-liquid diffusion layer 11A is too large, the active area will be lost. In one embodiment, the gas-liquid diffusion layer 15A has a pore size of 0.5 micrometers to 5 micrometers. If the pore size of the gas-liquid diffusion layer 15A is too small, the mass transfer resistance will be increased. If the pore size of the gas-liquid diffusion layer 15A is too large, the active area will be lost. In some embodiments, the gas-liquid diffusion layer 11A and the gas liquid diffusion layer 15A may have the same pore size, and the catalyst layer 11B and the catalyst 15B can be $M_xRu_yN_2$ with the same element ratio. In other words, the anode 11 and the cathode 15 can be the same electrode (with the gas-liquid diffusion layers of the same pore size and the catalyst layer of the same element ratio) to save the processes.

Alternatively, the gas-liquid diffusion layer 11A of the anode 11 and the gas-liquid diffusion layer 15A of the cathode 15 have different pore sizes and/or different compositions, or the catalyst layer 11B of the anode 11 and the catalyst layer 15B of the cathode 15 have different elements or different element ratios if necessary. For example, the catalyst layer 11B has a chemical structure of $M_xRu_yN_2$, the catalyst layer 15B has a chemical structure of $M_xRu_y$, and $M_xRu_y$ is cubic crystal system. In one embodiment, the $M_xRu_y$ has a granular surface morphology. Alternatively, the anode 11 or the cathode is a commercially available electrode (with another catalyst layer), and the other one includes the above nitride catalyst $M_xRu_yN_2$.

The membrane electrode assembly can be used to generate hydrogen by electrolysis. For example, the membrane electrode assembly can be dipped in alkaline aqueous solution. The alkaline aqueous solution can be an aqueous solution of NaOH, KOH, another suitable alkaline, or a combination thereof. In one embodiment, the alkaline aqueous solution has a pH value of greater than 14 and less than 15. If the pH value of the alkaline aqueous solution is too low, the conductivity of the alkaline aqueous solution will be poor. If the pH value of the alkaline aqueous solution is too high, the viscosity of the alkaline aqueous solution will be too high. The method also applies a voltage to the anode and the cathode to electrolyze the alkaline aqueous solution to generate hydrogen using the cathode and generate oxygen using the anode.

Accordingly, the nitride catalyst of the embodiments meets the requirement of electrolyzing alkaline aqueous solution to generate hydrogen. In HER aspect, the nitride catalyst may overcome the poor catalytic effect, poor conductivity, and low corrosion resistance, and other problems of conventional catalysts. In OER aspect, the nitride catalyst may overcome the poor catalytic effect, poor conductivity, low corrosion resistance, low anti-oxidation ability, and other problems of conventional catalysts. The nitride catalyst should have a high conductivity and high electrochemical activity of OER and HER. In view of the diffusion in the catalyst of the embodiments, the grain boundary diffusion coefficient is much larger than the body diffusion coefficient at a low temperature. The impurity atoms added into the nitride catalyst may fill the grain boundaries, which may block the diffusion of atoms via the grain boundaries for improving the catalyst performance. The fast diffusion path of the nitride catalyst (e.g. grain boundaries) can be filled by some material, thereby preventing the adjacent material atoms from diffusion via the grain boundaries or other defects.

The diffusion of the atoms via grain boundaries is greatly reduced by introducing nitrogen atoms or carbon atoms into the seams of grain boundaries. Accordingly, the nitride catalyst can increase the anti-oxidation ability and stability. Because the nitride catalyst has excellent conductivity and meets the requirements of activity and cost simultaneously, Ru (with an activity similar to Pt) and M can be combined to obtain the nitride catalyst with high conductivity and electrochemical activity.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Preparation Example 1

Pt catalyst was deposited on a glass carbon electrode (5 mm OD×4 mm H) by a reactive magnetron sputter. A Pt target was put into the sputter to be applied a power. Argon with a flow rate of 20 sccm was introduced into the sputter, and the pressure in the sputter was 30 mTorr. The Pt target was bombarded by argon ions to perform the sputtering at room temperature for 5 to 6 minutes, thereby forming the Pt catalyst with a thickness of about 100 nm on the glass carbon electrode. The loading amount of catalyst was 0.042 mg.

Preparation Example 2

$Ni_xRu_y$ catalysts of different element ratios were respectively deposited on glass carbon electrodes (5 mm OD×4 mm H) by the reactive magnetron sputter. A Ni target and a Ru target were put into the sputter, and powers applied to the Ni target (10 W to 200 W) and to the Ru target (10 W to 200 W) were adjusted. Argon with a flow rate of 20 sccm was introduced into the sputter, and the pressure in the sputter was 20 mTorr. The Ni target and the Ru target were bombarded by argon ions to perform the reactive sputtering at room temperature for 5 to 6 minutes, thereby respectively forming the $Ni_xRu_y$ catalysts with a thickness of about 100 nm on the glass carbon electrodes. The loading amount of catalyst was 0.024 mg. The $Ni_xRu_y$ catalysts had x of about 0.065 to 0.85 and y of about 1.935 to 1.15, which were determined by EDS. The $Ni_xRu_y$ catalysts had a granular surface morphology, which was determined by SEM. The $Ni_xRu_y$ catalysts were a cubic crystal system, which was determined by X-ray diffraction (XRD). In addition, only the Ru target was put into the sputter to form a Ru catalyst film with a thickness of 100 nm on the glass carbon electrode by similar conditions, and the catalyst loading amount was 0.024 mg.

Preparation Example 3

$Ni_xRu_yN_2$ catalysts of different element ratios were respectively deposited on glass carbon electrodes (5 mm OD×4 mm H) by the reactive magnetron sputter. A Ni target and a Ru target were put into the sputter, and powers applied to the Ni target (10 W to 200 W) and to the Ru target (10 W to 200 W) were adjusted. Nitrogen and argon with a total flow rate of 20 sccm (e.g. nitrogen:(nitrogen+argon)=50: 100) were introduced into the sputter, and the pressure in the sputter was 20 mTorr. The Ni target and the Ru target were bombarded by argon ions to perform the reactive sputtering at room temperature for 5 to 6 minutes, thereby respectively forming the $Ni_xRu_yN_2$ catalysts with a thickness of about 100 nm on the glass carbon electrodes. The loading amount of catalyst was 0.024 mg. The $Ni_xRu_yN_2$ catalysts had x of about 0.069 to 1.086 and y of about 1.931 to 0.914, which were determined by EDS. The $Ni_xRu_yN_2$ catalysts had surface morphology of a tetrahedron or a pyramid, which were determined by SEM. The $Ni_xRu_yN_2$ catalysts were cubic crystal system or amorphous, which were determined by XRD. In addition, only the Ru target was put into the sputter to form a $Ru_2N_2$ catalyst film with a thickness of 100 nm on the glass carbon electrode by similar conditions, and the catalyst loading amount was 0.024 mg.

Example 1

Figure 2:
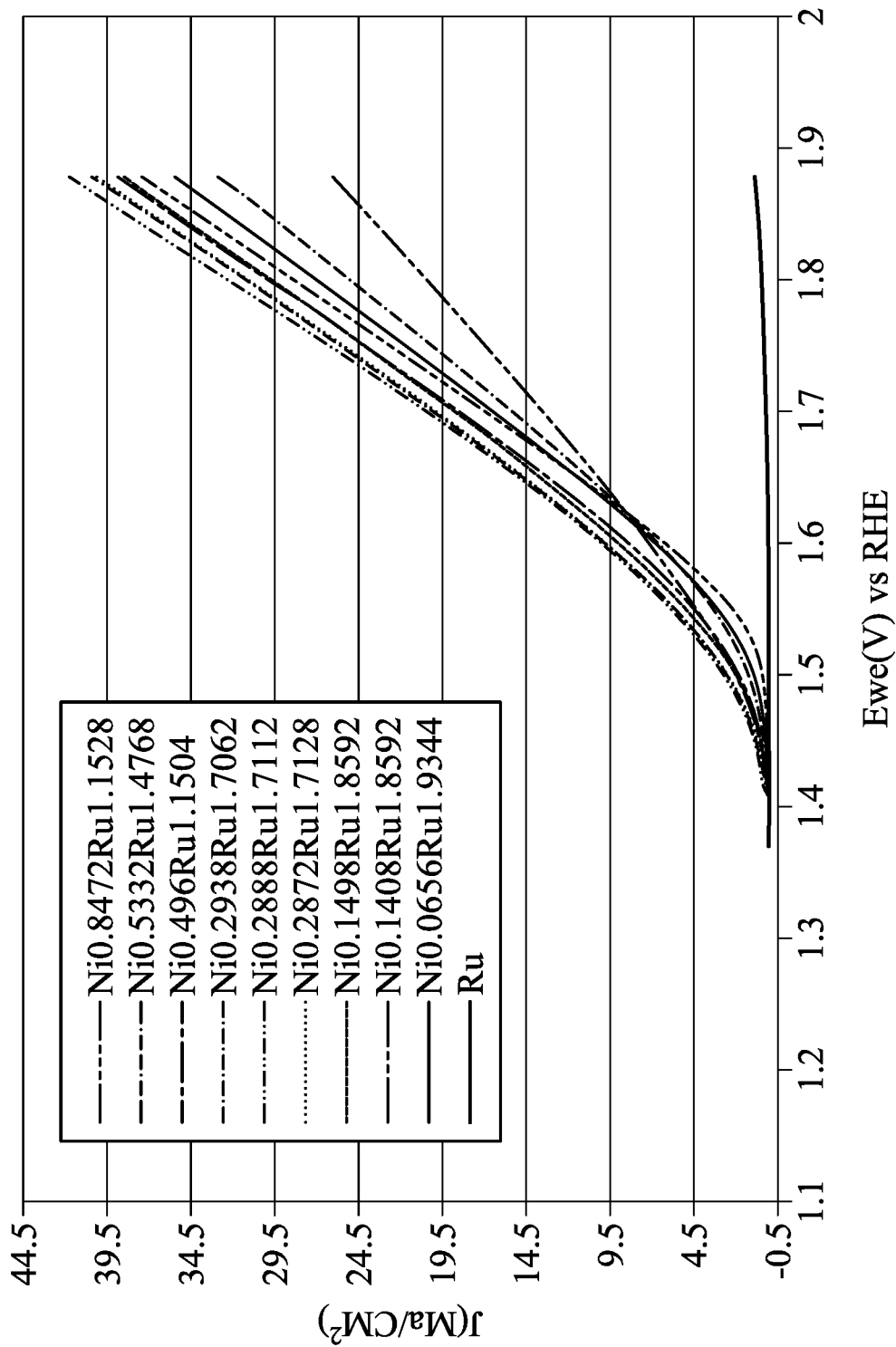
FIG. 2 shows OER curves of Ru catalyst and $Ni_xRu_y$ catalysts in one embodiment.
Figure 3:
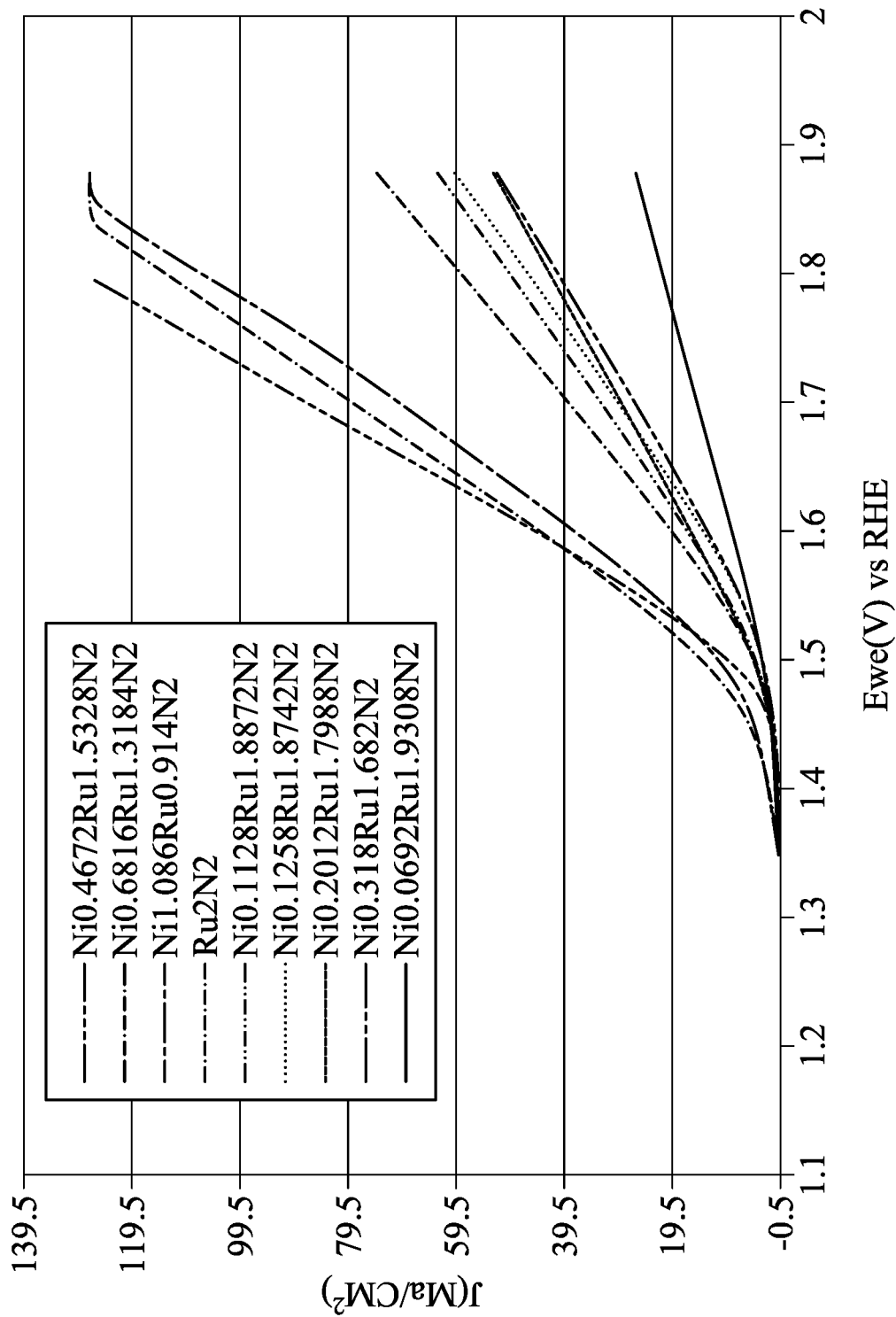
FIG. 3 shows OER curves of $Ru_2N_2$ catalyst and $Ni_xRu_yN_2$ catalysts in one embodiment.

The OER electrochemical activities of the Pt, Ru, $Ru_2N_2$, $Ni_xRu_y$, and $Ni_xRu_yN_2$ catalysts were tested as indicated below. In 0.1M KOH solution, the glass carbon electrode with the Pt, Ru, $Ru_2N_2$, $Ni_xRu_y$, or $Ni_xRu_yN_2$ catalyst formed thereon served as a working electrode. Hg/HgO served as a reference electrode, and platinum served as an auxiliary electrode. The scan voltage ranged from −0.8V to 1V, the scan rate was 50 mV/s, and the number of scans was 10. Subsequently, the CV measurement of the OER was performed, in which the scan voltage ranged from −0.8V to 0.1V, the scan rate was 10 mV/s, and the number of scans was 5. The OER results are shown in FIG. 2 (e.g. Ru and $Ni_xRu_y$) and FIG. 3 ($Ru_2N_2$ and $Ni_xRu_yN_2$). The horizontal axis in FIGS. 2 and 3 is potential (V) of reversible hydrogen electrode (RHE), and the vertical axis in FIGS. 2 and 3 is current density (J, mA/cm$^2$). As shown in FIG. 2, the pure Ru catalyst was free of the OER activity, and the activities of the Ru catalysts doped with appropriate amounts of Ni were obviously enhanced. As shown in FIG. 3, the activity of the $Ru_2N_2$ catalyst was much higher than the activity of the Ru catalyst, and the activities of the $Ru_2N_2$ catalysts doped with appropriate amounts of Ni (e.g. $Ni_xRu_yN_2$ catalysts) were greatly enhanced. For example, the $Ni_xRu_yN_2$ with x of 0.4 to 1.1 could have a better performance. A comparison of some catalysts is shown in Table 1:

TABLE 1

| OER comparison | Best current density (mA/cm$^2$) at the RHE potential of 1.65 V | Initial potential (V) for electrolysis of water (current density was set to 0.5 mA/cm$^2$) |
|---|---|---|
| Pt film | ~10 | 1.48-1.5 |
| $Ni_{0.29}Ru_{1.71}$ | ~15 | 1.4-1.55 |
| $Ni_{0.46}Ru_{1.53}N_2$ | ~65 | 1.4-1.5 |

As shown in Table 1, the current densities of the $Ni_{0.29}Ru_{1.71}$ and $Ni_{0.46}Ru_{1.53}N_2$ catalysts were higher than the current density of the Pt film catalyst in OER. However, the $Ni_xRu_y$ was free of the anti-oxidation ability, it should be improper to be applied in OER. In other words, the $Ni_{0.46}Ru_{1.53}N_2$ catalyst was more suitable than the Pt film catalyst in the application of OER.

Example 2

Figure 4:
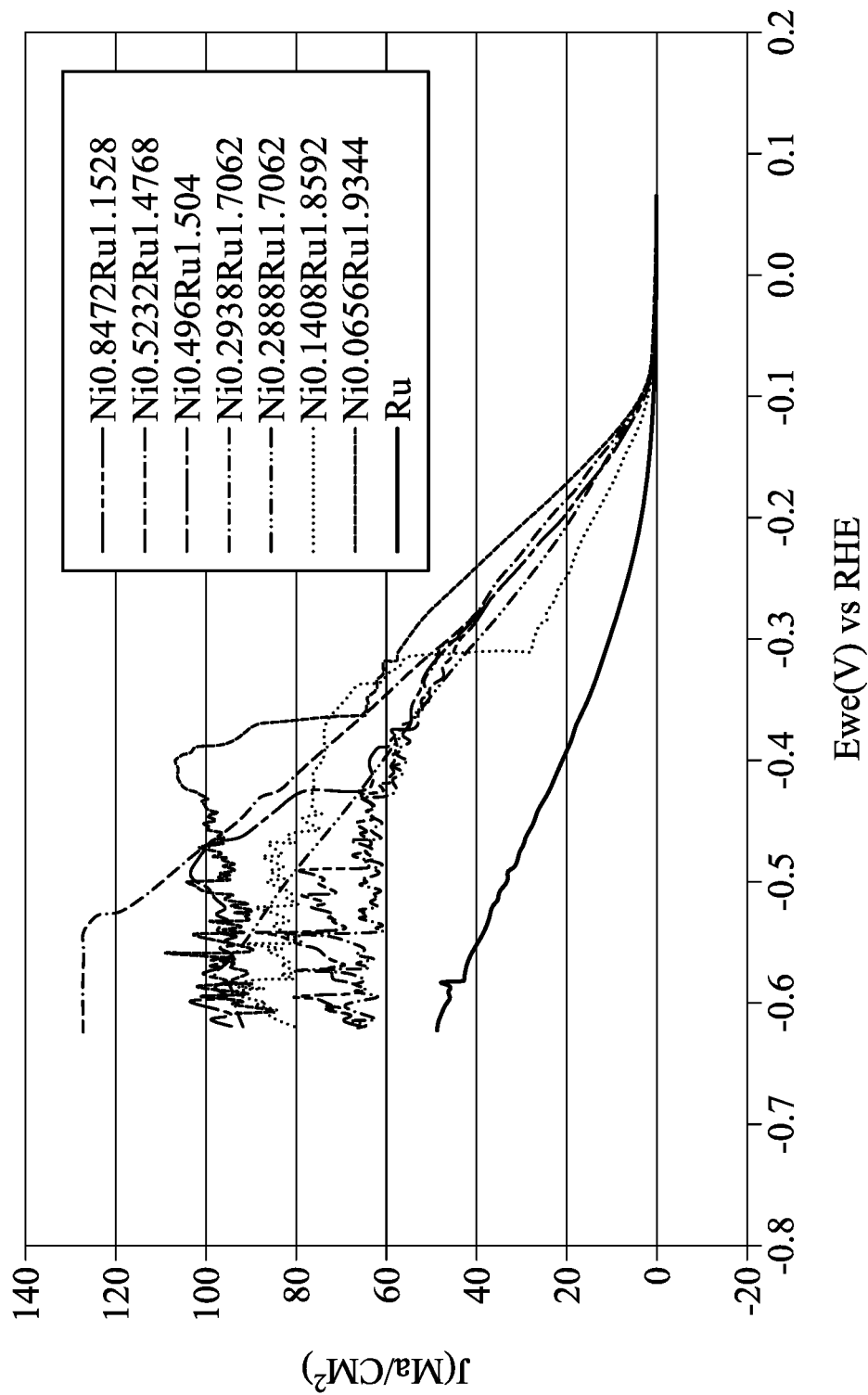
FIG. 4 shows HER curves of Ru catalyst and $Ni_xRu_y$ catalysts in one embodiment.
Figure 5:
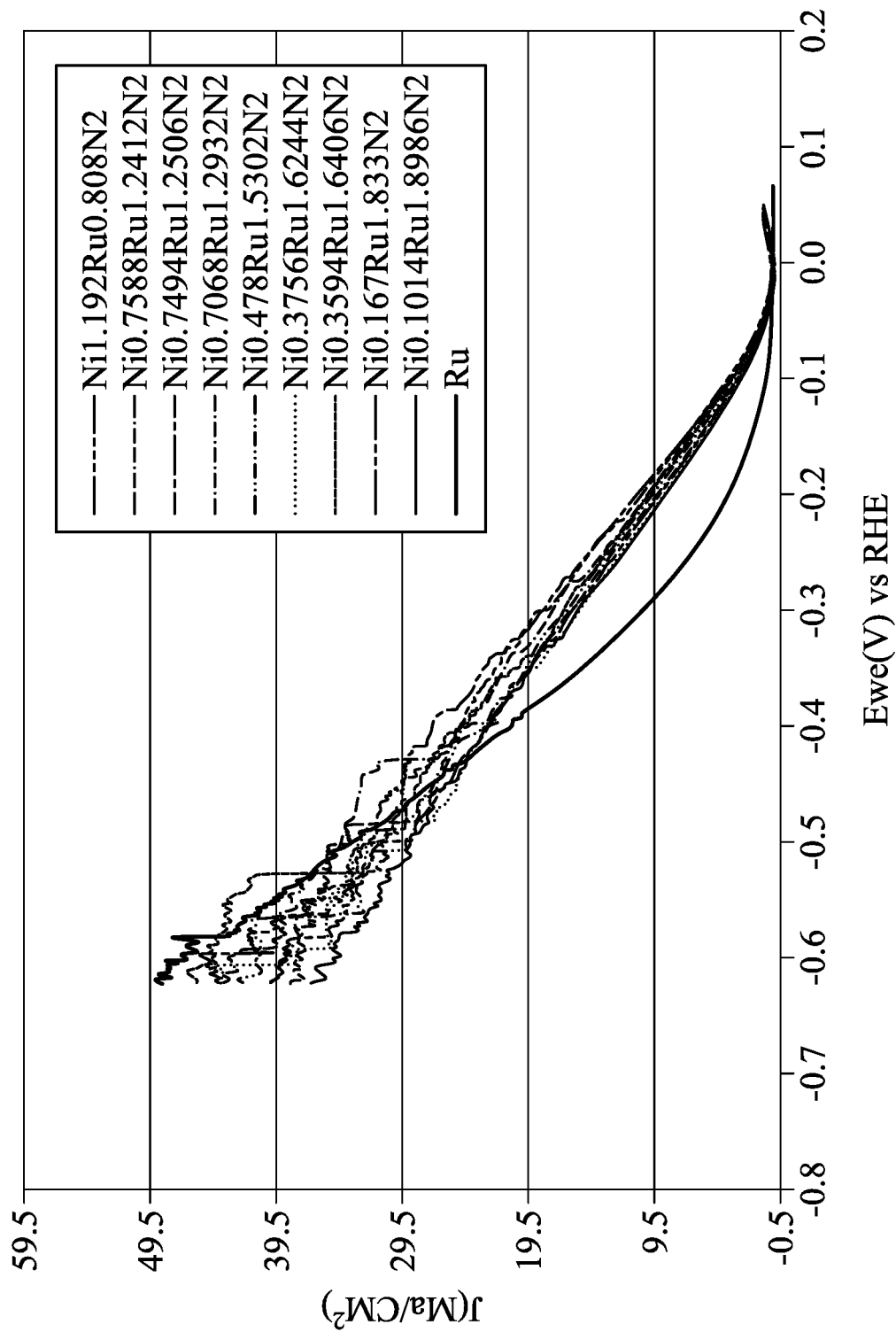
FIG. 5 shows HER curves of Ru catalysts and $Ni_xRu_yN_2$ catalysts in one embodiment.

The HER electrochemical activities of the Pt, Ru, $Ni_xRu_y$, and $Ni_xRu_yN_2$ catalysts were tested as indicated below. In 0.1M KOH solution, the glass carbon electrode with the Pt, Ru, $Ru_2N_2$, $Ni_xRu_y$, or $Ni_xRu_yN_2$ catalyst formed thereon served as a working electrode. Hg/HgO served as a reference electrode, and platinum served as an auxiliary electrode. In measurements of the HER, the working electrode was rotated at 1600 rpm, the scan voltage ranged from 0 to 1V, the scan rate was 10 mV/s, and the number of scans was 3. The HER results are shown in FIG. 4 (e.g. Ru and $Ni_xRu_y$) and FIG. 5 (Ru and $Ni_xRu_yN_2$). The horizontal axis in FIGS. 2 and 3 is potential (V) of reversible hydrogen electrode (RHE), and the vertical axis in FIGS. 2 and 3 is current density (J, mA/cm$^2$). As shown in FIG. 4, the activities of the Ru catalysts doped with Ni (e.g. $Ni_xRu_y$) were obviously higher than the activity of the Ru catalyst. A comparison of some catalysts is shown in Table 2:

TABLE 2

| HER comparison | Best current density (mA/cm$^2$) at the RHE potential of 0.3 V |
|---|---|
| Pt film | 14 |
| Ru film | ~10 |
| $Ni_{0.06}Ru_{1.93}$ | 55 |
| $Ni_{1.2}Ru_{0.8}N_2$ | 19.5 |

As shown above, the current densities of the $Ni_{0.06}Ru_{1.93}$ and $Ni_{1.2}Ru_{0.8}N_2$ catalysts were higher than the current density of the Pt film catalyst in HER. In other words, the $Ni_{0.06}Ru_{1.93}$ and $Ni_{1.2}Ru_{0.8}N_2$ catalysts were more suitable than the Pt film catalyst in the application of HER.

Preparation Example 4

$Mn_xRu_yN_2$ catalysts of different element ratios were respectively deposited on glass carbon electrodes (5 mm OD×4 mm H) by the reactive magnetron sputter. An Mn target and a Ru target were put into the sputter, and powers applied to the Mn target (10 W to 200 W) and to the Ru target (10 W to 200 W) were adjusted. Nitrogen and argon with a total flow rate of 20 sccm (e.g. nitrogen:(nitrogen+argon)=50:100) were introduced into the sputter, and the pressure in the sputter was 20 mTorr. The Mn target and the Ru target were bombarded by argon ions to perform the reactive sputtering at room temperature for 5 to 6 minutes, thereby respectively forming the $Mn_xRu_yN_2$ catalysts with a thickness of about 100 nm on the glass carbon electrodes. The loading amount of catalyst was 0.024 mg. The $Mn_xRu_yN_2$ catalysts had x of about 0.01 to 0.8 and y of about 1.2 to 1.99, which were determined by EDS. The $Mn_xRu_yN_2$ catalysts had surface morphology of a tetrahedron or a pyramid, which were determined by SEM. The $Mn_xRu_yN_2$ catalysts were cubic crystal system or amorphous, which were determined by XRD.

Example 3

Figure 6:
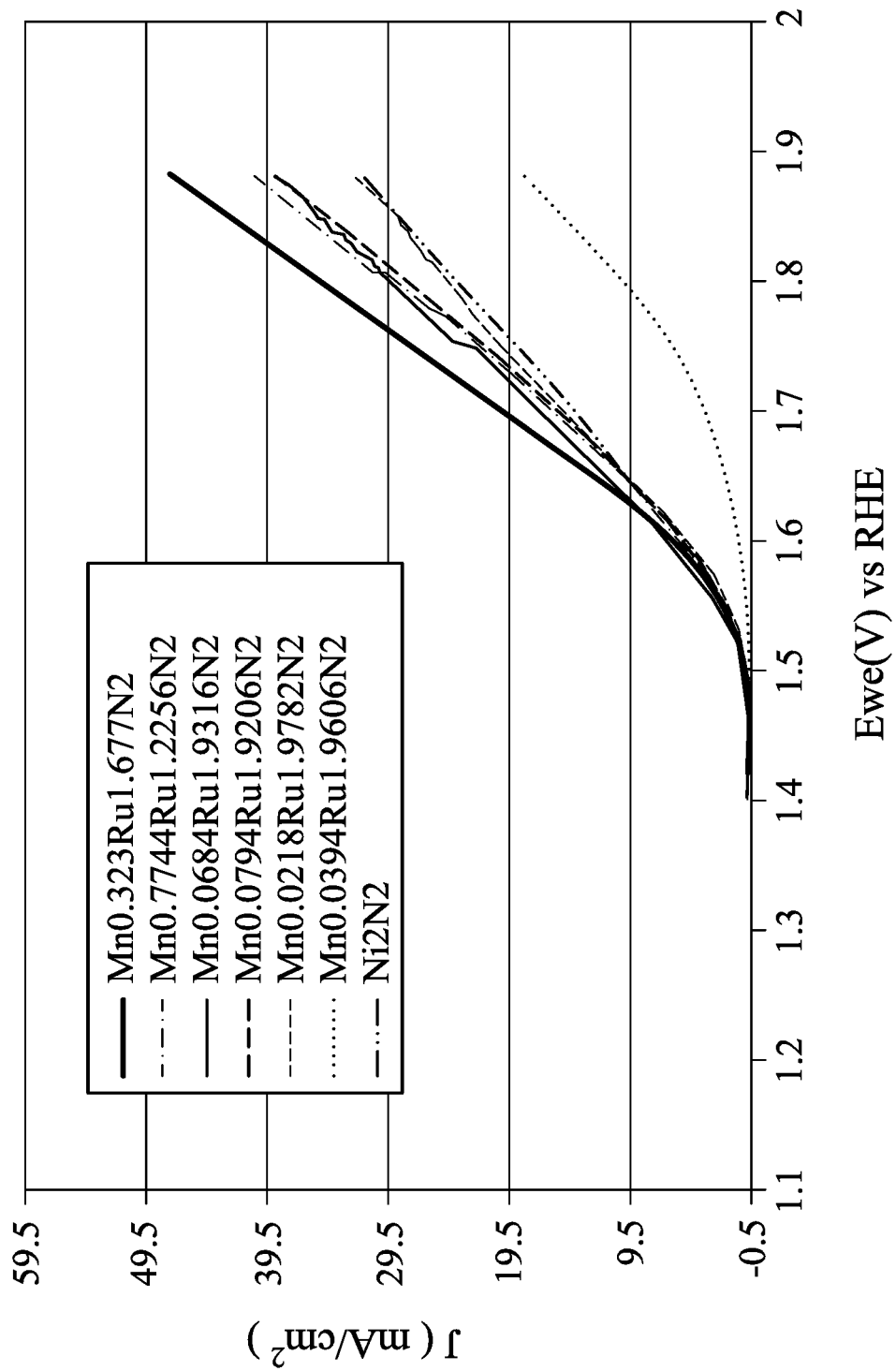
FIG. 6 shows OER curves of $Ni_2N_2$ catalyst and $Mn_xRu_yN_2$ catalysts in one embodiment.

The OER electrochemical activities of the $Mn_xRu_yN_2$ catalysts were tested as indicated below. In 0.1M KOH solution, the glass carbon electrode with the $Mn_xRu_yN_2$ catalyst formed thereon served as a working electrode. Hg/HgO served as a reference electrode, and platinum served as an auxiliary electrode. The working electrode was rotated at 1600 rpm. The scan voltage ranged from −0.8V to 1V, the scan rate was 50 mV/s, and the number of scans was 10. Subsequently, the CV measurement of the OER was performed, in which the scan voltage ranged from −0.8V to 0.1V, the scan rate was 10 mV/s, and the number of scans was 5. The OER results are shown in FIG. 6 ($Ni_2N_2$ and $Mn_xRu_yN_2$). The horizontal axis in FIG. 6 is potential (V) of reversible hydrogen electrode (RHE), and the vertical axis in FIG. 6 is current density (J, mA/cm$^2$). As shown in FIG. 6, the activities of the $Ru_2N_2$ catalysts doped with appropriate amounts of Mn (e.g. $Mn_xRu_yN_2$ catalysts) were greatly enhanced. For example, the $Mn_xRu_yN_2$ with x of 0.3 to 0.7 could have a better performance. A comparison of some catalysts is shown in Table 3:

TABLE 3

| OER comparison | Best current density (mA/cm$^2$) at the RHE potential of 1.65 V | Initial potential (V) for electrolysis of water (current density was set to 0.5 mA/cm$^2$) |
|---|---|---|
| Pt film | ~10 | 1.48-1.5 |
| $Mn_{0.323}Ru_{1.677}N_2$ | 13 | 1.5-1.55 |

As shown in Table 3, the current density of the $Mn_{0.323}Ru_{1.677}N_2$ catalyst was higher than the current density of the Pt film catalyst in OER. In other words, the $Mn_{0.323}Ru_{1.677}N_2$ catalyst was more suitable than the Pt film catalyst in the application of OER.

Example 4

Figure 7:
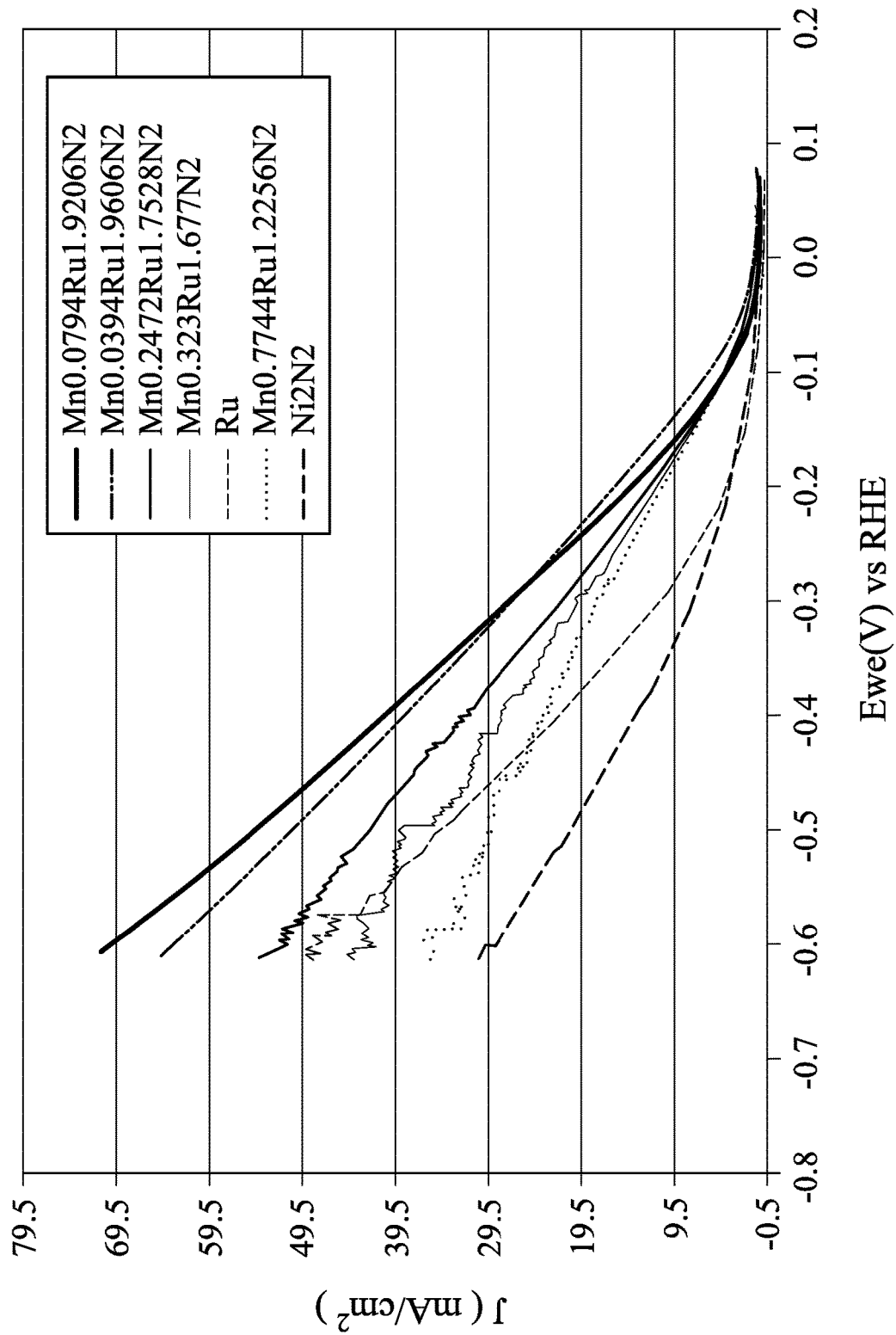
FIG. 7 shows HER curves of $Ni_2N_2$ catalyst and $Mn_xRu_yN_2$ catalysts in one embodiment.

The HER electrochemical activities of the $Mn_xRu_yN_2$ catalysts were tested as indicated below. In 0.1M KOH solution, the glass carbon electrode with the $Mn_xRu_yN_2$ catalyst formed thereon served as a working electrode. Hg/HgO served as a reference electrode, and platinum served as an auxiliary electrode. In measurements of the HER, the working electrode was rotated at 1600 rpm, the scan voltage ranged from 0 to 1V, the scan rate was 10 mV/s, and the number of scans was 3. The HER results are shown in FIG. 7. The horizontal axis in FIG. 7 is potential (V) of reversible hydrogen electrode (RHE), and the vertical axis in FIG. 7 is current density (J, mA/cm$^2$). A comparison of some catalysts is shown in Table 4:

TABLE 4

| HER comparison | Best current density (mA/cm$^2$) at the RHE potential of 0.3 V |
|---|---|
| Pt film | 14 |
| Ru film | ~10 |
| $Mn_{0.079}Ru_{1.92}N_2$ | 28 |

As shown above, the current density of the $Mn_{0.079}Ru_{1.92}N_2$ catalyst was higher than the current density of the Pt film catalyst in HER. In other words, the $Mn_{0.079}Ru_{1.92}N_2$ catalyst was more suitable than the Pt film catalyst in the application of HER.

Preparation Example 5

$Ni_{0.75}Ru_{1.25}N_2$ catalyst was deposited on stainless steel mesh (316 stainless steel, 200 mesh, 50 mm×50 mm) by the reactive magnetron sputter. A Ni target and a Ru target were put into the sputter, and powers applied to the Ni target (150 W) and to the Ru target (100 W) were adjusted. Nitrogen and argon with a total flow rate of 10 sccm (e.g. nitrogen:(nitrogen+argon)=50:100) were introduced into the sputter, and the pressure in the sputter was 5 mTorr. The Ni target and the Ru target were bombarded by argon ions to perform the reactive sputtering at room temperature for 8 minutes, thereby forming the $Ni_{0.75}Ru_{1.25}N_2$ catalysts (determined by EDS) with a thickness of about 300 nm on the stainless steel mesh. The loading amount of catalyst per area was 0.17 mg/cm². The $Ni_{0.75}Ru_{1.25}N_2$ catalyst was cubic crystal systems, which was determined by XRD. The $Ni_{0.75}Ru_{1.25}N_2$ catalysts had surface morphology of a tetrahedron or a pyramid, which were determined by SEM. The $Ni_{0.75}Ru_{1.25}N_2$ catalysts were cubic crystal system or amorphous, which were determined by XRD.

Example 5

Figure 8:
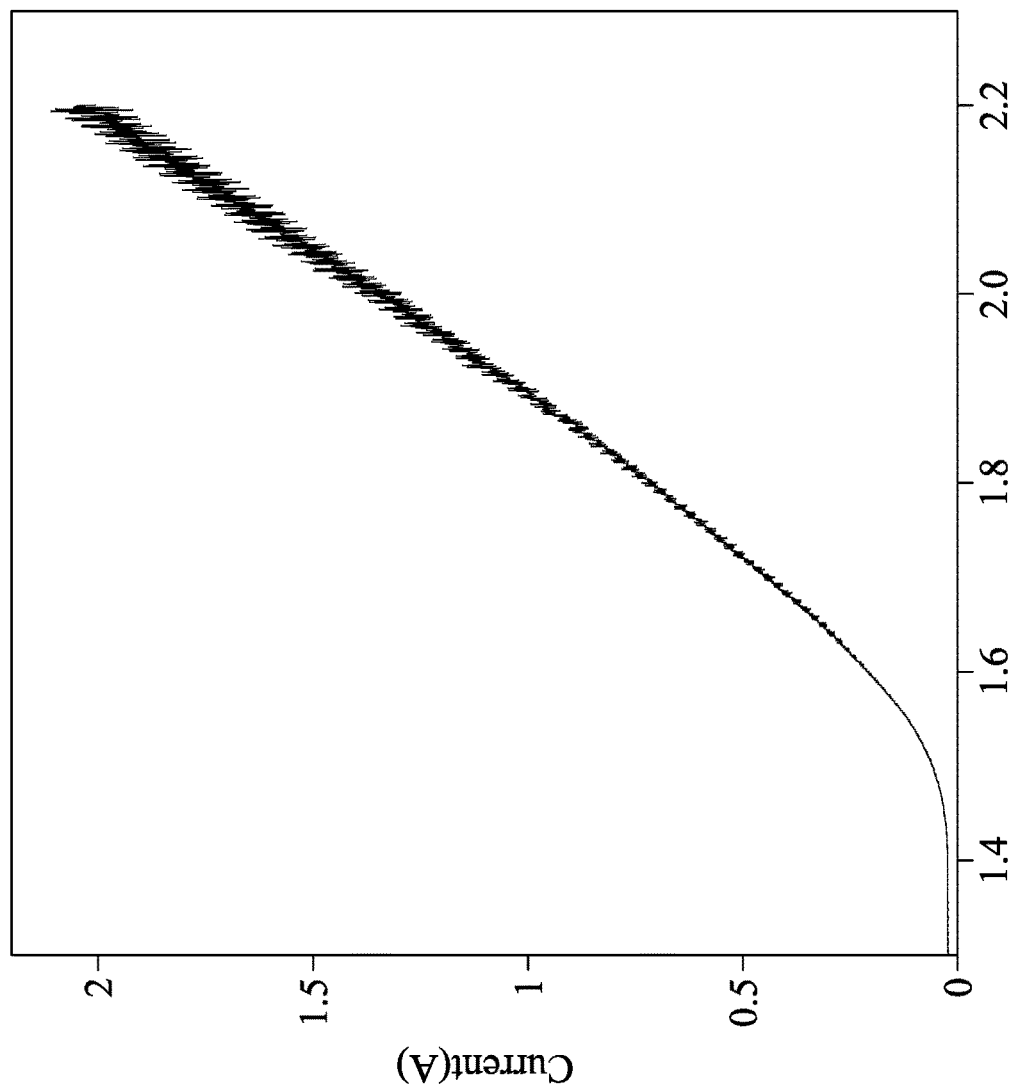
FIGS. 8, 9 and 11 show curves of current versus voltage of membrane electrode assemblies in the embodiments.

The $Ni_{0.75}Ru_{1.25}N_2$-stainless steel mesh in Preparation Example 5 served as the cathode of HER. Commercially available insoluble anode ($IrO_2/RuO_2$—Ti mesh, Ultrapack Energy Co., Ltd) served as the anode of OER, and an anion exchange film X37-50 (commercially available from Dioxide Materials) was interposed between the catalyst layers of the cathode and the anode to obtain a membrane electrode assembly. The membrane electrode assembly was dipped in 2M KOH solution to test its electrochemical activity. The scan voltage ranged from 1.3V to 2.2V and the scan rate was 50 mV/s. The curve of current versus voltage of the membrane electrode assembly is shown in FIG. 8. The membrane electrode assembly could generate a current of 1.35 A at 2V.

Example 6

Figure 9:
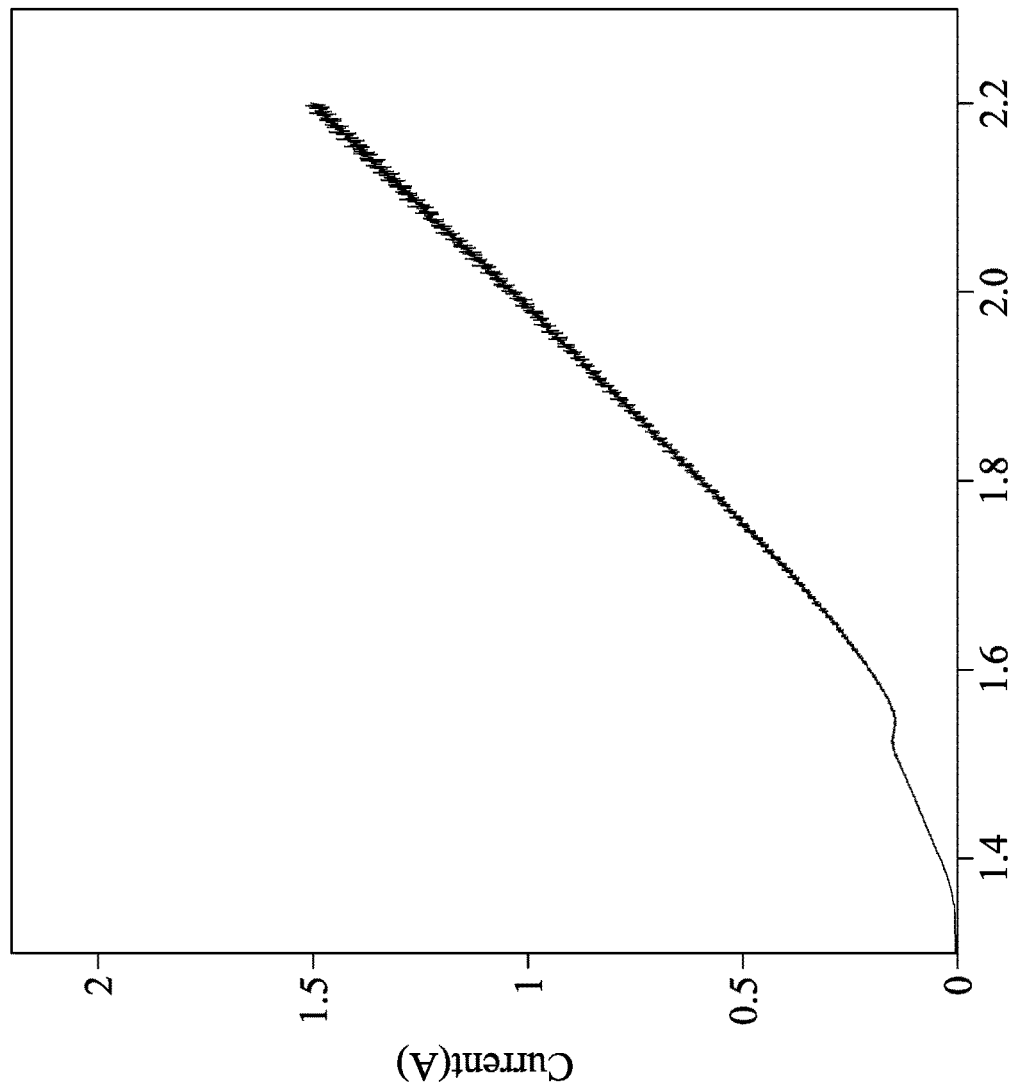
Figure 10:
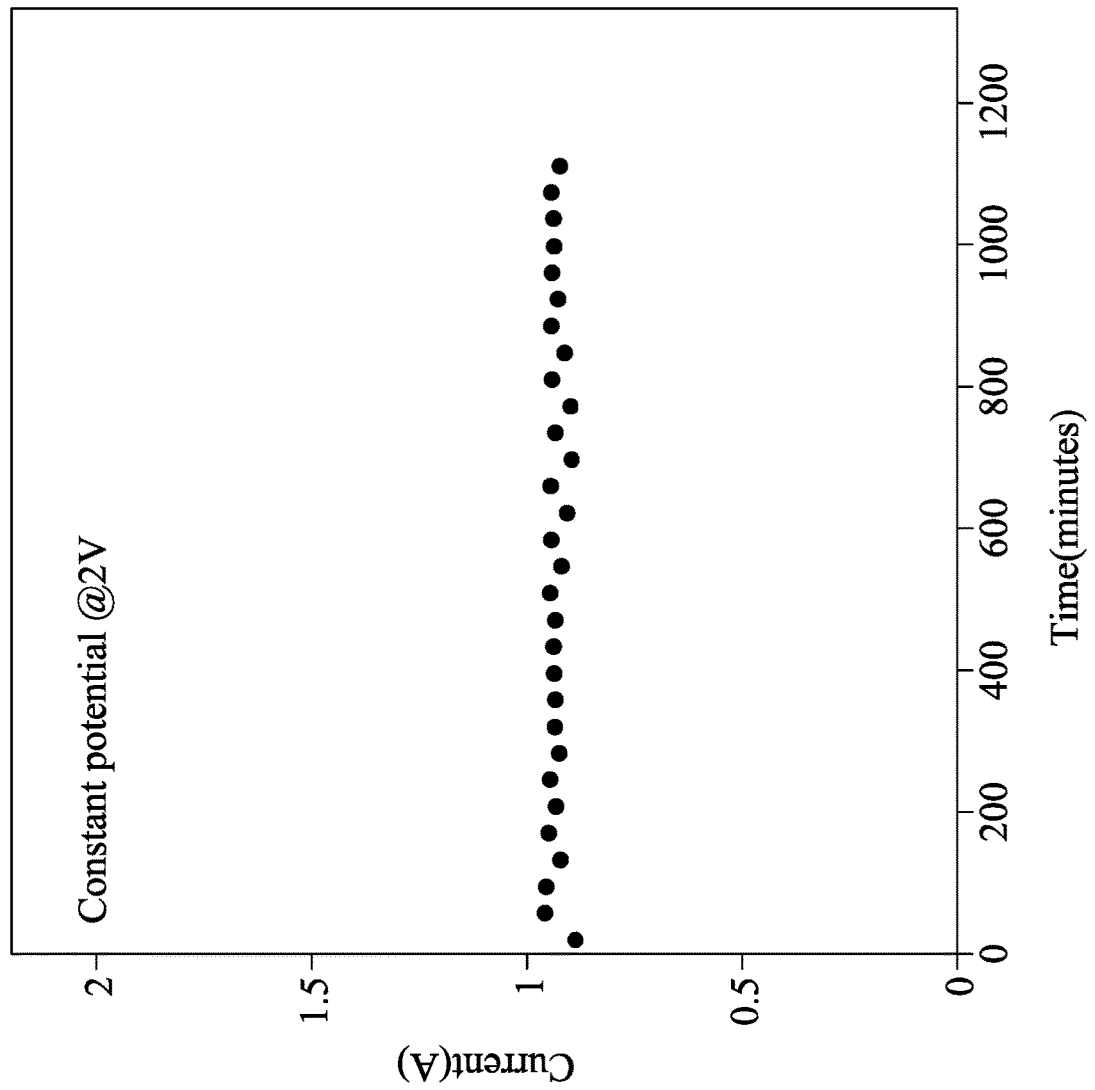
FIG. 10 shows the current diagram of a membrane electrode assembly after long-term use in one embodiment.

One $Ni_{0.75}Ru_{1.25}N_2$-stainless steel mesh in Preparation Example 5 served as the cathode of HER, and another one $Ni_{0.75}Ru_{1.25}N_2$-stainless steel mesh in Preparation Example 5 served as the anode of OER. An anion exchange film X37-50 (commercially available from Dioxide Materials) was interposed between the catalyst layers of the cathode and the anode to obtain a membrane electrode assembly. The membrane electrode assembly was dipped in 2M KOH solution to test its electrochemical activity. The scan voltage ranged from 1.3V to 2.2V and the scan rate was 50 mV/s. The curve of current versus voltage of the membrane electrode assembly is shown in FIG. 9. The membrane electrode assembly could generate a current of 1.02 A at 2V. The potential of the membrane electrode assembly was controlled at 2V to continuously operate 18 hours, and its current was stable as shown in FIG. 10. In other words, the $Ni_{0.75}Ru_{1.25}N_2$-stainless steel mesh could withstand the oxidation to serve as the anode of OER.

Comparative Example 1

Figure 11:
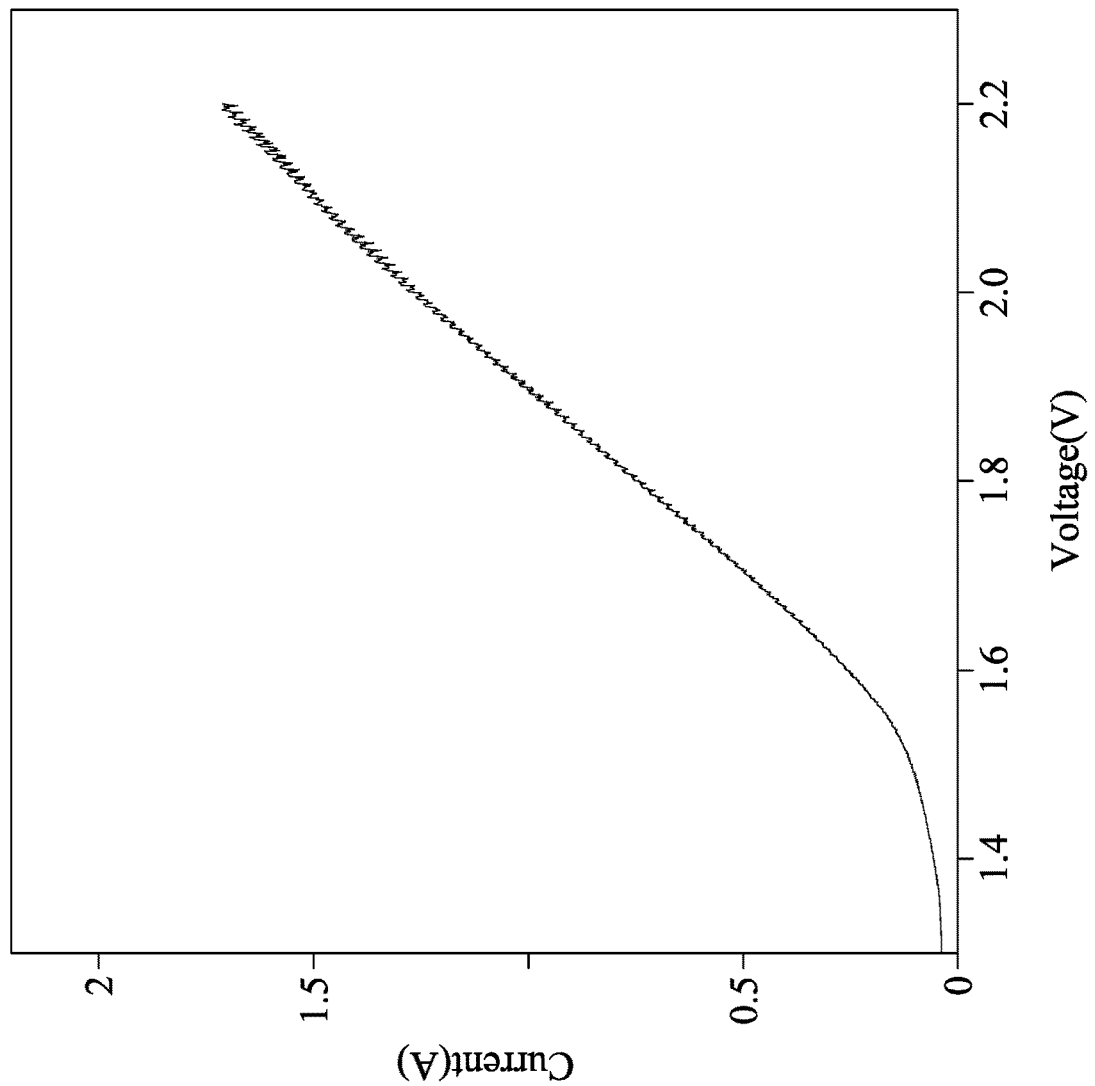

Commercially available PtC (HISPEC 13100, Johnson Matthey) was coated on a carbon paper H23C8 (Freudenberg) to serve as a cathode of HER, and the loading amount of cathode catalyst per area was controlled to 1.8 mg/cm². Commercially available insoluble anode ($IrO_2/RuO_2$—Ti mesh, Ultrapack Energy Co., Ltd) served as the anode of OER, and an anion exchange film X37-50 (commercially available from Dioxide Materials) was interposed between the catalyst layers of the cathode and the anode to obtain a membrane electrode assembly. The membrane electrode assembly was dipped in 2M KOH solution to test its electrochemical activity. The scan voltage ranged from 1.3V to 2.2V and the scan rate was 50 mV/s. The curve of current versus voltage of the membrane electrode assembly is shown in FIG. 11. The membrane electrode assembly could generate a current of 1.3 A at 2V.

Comparison between the membrane electrode assemblies of Example 5, Example 6 and Comparative Example 1 are shown in Table 5.

TABLE 5

|  | Cathode | Loading amount of catalyst per area (mg/cm²) | Anode | Loading amount of catalyst per area (mg/cm²) | Catalyst activity (A/mg) at 2 V (A/mg) |
|---|---|---|---|---|---|
| Comparative Example 1 | PtC/H23C8 | 1.8 | $IrO_2/RuO_2$—Ti mesh | 2 | 0.03 |
| Example 5 | $Ni_{0.75}Ru_{1.25}N_2$-stainless mesh | 0.17 | $IrO_2/RuO_2$—Ti mesh | 2 | 0.32 |
| Example 6 | $Ni_{0.75}Ru_{1.25}N_2$-stainless mesh | 0.17 | $Ni_{0.75}Ru_{1.25}N_2$-stainless mesh | 0.17 | 0.24 |

As shown in Table 5, the catalyst activity of the $Ni_{0.75}Ru_{1.25}N_2$ catalyst in Examples 5 and 6 were much higher than the catalyst activity of the PtC and $IrO_2/RuO_2$. In addition, the loading amount of catalyst per area of the $Ni_{0.75}Ru_{1.25}N_2$ catalyst was only 1/10 of the loading amount of catalyst per area of the PtC and $IrO_2/RuO_2$ catalysts.

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:
1. A nitride catalyst, having a chemical formula of

$M_xRu_yN_2$, wherein M is Ni, Co, Fe, Mn, Cr, V, Ti, Cu, or Zn; $0<x<1.3$, $0.7<y<2$, and $x+y=2$,
wherein the nitride catalyst is a cubic crystal system or amorphous.
2. The nitride catalyst as claimed in claim 1, wherein M is Ni, $0.069<x<1.086$, and $0.914<y<1.931$.
3. The nitride catalyst as claimed in claim 1, wherein M is Mn, $0.01<x<0.8$, and $1.2<y<1.99$.

4. The nitride catalyst as claimed in claim 1, having a surface morphology of a tetrahedron or a pyramid.

\* \* \* \* \*